US012761553B2

(12) United States Patent
Ohashi et al.

(10) Patent No.: US 12,761,553 B2
(45) Date of Patent: Oct. 13, 2026

(54) RESIST COMPOSITION AND PATTERNING PROCESS

(71) Applicant: Shin-Etsu Chemical Co., Ltd., Tokyo (JP)

(72) Inventors: Masaki Ohashi, Joetsu (JP); Shun Kikuchi, Joetsu (JP); Seiichiro Tachibana, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 698 days.

(21) Appl. No.: 18/143,216

(22) Filed: May 4, 2023

(65) Prior Publication Data

US 2023/0367211 A1 Nov. 16, 2023

(30) Foreign Application Priority Data

May 12, 2022 (JP) ................................. 2022-078510

(51) Int. Cl.

| | |
|---|---|
| ***G03F 7/004*** | (2006.01) |
| ***G03F 7/027*** | (2006.01) |
| ***G03F 7/20*** | (2006.01) |
| ***G03F 7/32*** | (2006.01) |

(52) U.S. Cl.

CPC ............ *G03F 7/0045* (2013.01); *G03F 7/027* (2013.01); *G03F 7/2004* (2013.01); *G03F 7/325* (2013.01)

(58) Field of Classification Search

CPC ..................................................... G03F 7/0045

See application file for complete search history.

(56) References Cited

U.S. PATENT DOCUMENTS

| | | | | |
|---|---|---|---|---|
| 9,563,123 | B2 * | 2/2017 | Masuyama .......... | C07D 321/10 |
| 10,323,113 | B2 | 6/2019 | Hatakeyama et al. | |
| 2020/0010594 | A1 | 1/2020 | Masuyama et al. | |
| 2021/0347791 | A1 | 11/2021 | Cardineau et al. | |
| 2021/0405528 | A1 | 12/2021 | Hatakeyama | |

FOREIGN PATENT DOCUMENTS

| | | | |
|---|---|---|---|
| JP | H09006002 | A * | 1/1997 |
| JP | 2015-180928 | A | 10/2015 |
| JP | 2018-5224 | A | 1/2018 |
| JP | 2018-95853 | A | 6/2018 |
| JP | 2020098332 | A * | 6/2020 |
| JP | 2021-503482 | A | 2/2021 |
| KR | 2021-0156772 | A | 12/2021 |

OTHER PUBLICATIONS

English translation of JP2020098332. (Year: 2020).*
English translation of JPH09006002. (Year: 1997).*
Hinsberg et al., "Extendibility of Chemically Amplified Resists : Another Brick Wall?", SPIE, 2003, vol. 5039, pp. 1-14, (14 pages).
Kishikawa et al., "Assessment of trade-off between resist resolution and sensitivity for optimization of hyper-NA Immersion lithography", SPIE, 2007, vol. 6520, pp. 65203L-1-65203L-9, (9 pages).
Office Action dated Sep. 5, 2024, issued in counterpart KR Application No. 10-2023-0059115 with English translation. (9 pages).

* cited by examiner

*Primary Examiner* — Mark F. Huff
*Assistant Examiner* — Anna Malloy
(74) *Attorney, Agent, or Firm* — WHDA, LLP

(57) ABSTRACT

A resist composition comprising a hypervalent iodine compound having at least two acyloxy groups, a carboxylic acid, and a solvent is provided. When processed by lithography using high-energy radiation, the resist composition exhibits a high sensitivity and resolution.

7 Claims, No Drawings

RESIST COMPOSITION AND PATTERNING PROCESS

CROSS-REFERENCE TO RELATED APPLICATIONS

This non-provisional application claims priority under 35 U.S.C. § 119(a) on Patent Application No. 2022-078510 filed in Japan on May 12, 2022, the entire contents of which are hereby incorporated by reference.

TECHNICAL FIELD

This invention relates to a resist composition and a pattern forming process.

BACKGROUND ART

While a higher integration density, higher operating speed and lower power consumption of LSIs are demanded to comply with the expanding IoT market, the effort to reduce the pattern rule is in rapid progress. The wide-spreading logic device market drives forward the miniaturization technology. As the advanced miniaturization technology, microelectronic devices of 10-nm node are manufactured in a mass scale by the double, triple or quadro-patterning version of the immersion ArF lithography. Active research efforts have been made on the manufacture of 7-nm node devices by the next generation EUV lithography of wavelength 13.5 nm.

As the feature size is reduced, image blurs due to acid diffusion become a problem (see Non-Patent Document 1). To insure resolution for fine patterns with a feature size of 45 nm et seq., not only an improvement in dissolution contrast is requisite, but the control of acid diffusion is also important (see Non-Patent Document 2). Since chemically amplified resist compositions are designed such that sensitivity and contrast are enhanced by acid diffusion, an attempt to minimize acid diffusion by reducing the temperature and/or time of post-exposure bake (PEB) fails, resulting in drastic reductions of sensitivity and contrast.

Addition of an acid generator capable of generating a bulky acid is effective for suppressing acid diffusion. It is then proposed to copolymerize a polymer with an acid generator in the form of an onium salt having polymerizable olefin. With respect to the patterning of a resist film to a feature size of 16 nm et seq., it is believed impossible in the light of acid diffusion to form such a pattern from a chemically amplified resist composition. It would be desirable to have a non-chemically amplified resist composition.

A typical non-chemically amplified resist material is polymethyl methacrylate (PMMA). It is a positive resist material which increases solubility in organic solvent developer through the mechanism that the molecular weight becomes lower as a result of scission of the main chain upon EUV exposure.

Hydrogensilsesquioxane (HSQ) is a negative resist material which turns insoluble in alkaline developer through crosslinking by condensation reaction of silanol generated upon EUV exposure. Also chlorine-substituted calixarene functions as negative resist material. Since these negative resist materials have a small molecular size prior to crosslinking and avoid any blur caused by acid diffusion, they exhibit reduced edge roughness and very high resolution. They are thus used as a pattern transfer material for representing the resolution limit of the exposure tool. However, these materials are insufficient in sensitivity, with further improvements being needed.

One of the causes that retard the development of EUV lithography materials is a small number of photons available with EUV exposure. The energy of EUV is extremely higher than that of ArF excimer laser. The number of photons available with EUV exposure is 1/14 of the number by ArF exposure. The size of pattern features formed by the EUV lithography is less than half the size by the ArF lithography. Therefore, the EUV lithography is quite sensitive to a variation of photon number. A variation in number of photons in the radiation region of extremely short wavelength is shot noise as a physical phenomenon. It is impossible to eliminate the influence of shot noise. Attention is thus paid to stochastics. While it is impossible to eliminate the influence of shot noise, discussions are held how to reduce the influence. There is observed a phenomenon that under the influence of shot noise, values of CDU and LWR are increased and holes are blocked at a probability of one several millionth. The blockage of holes leads to electric conduction failure to prevent transistors from operation, adversely affecting the performance of an overall device. Ii view of their application to the resist at a practically acceptable sensitivity, resist compositions based on PMMA or HSQ are largely affected by stochastics, failing to gain the desired resolution.

As the means for reducing the influence of shot noise on the resist side, it is noteworthy to incorporate an element having high EUV absorption. Patent Document 1 discloses a chemically amplified resist composition containing highly EUV-absorbing iodine atoms. However, as mentioned above, the chemically amplified resist composition cannot reach the resolution desired in the EUV lithography where the pattern feature size becomes smaller than ever.

Patent Document 2 discloses a negative resist composition comprising a tin compound. Based on tin element having high EUV absorption, this resist composition is improved in stochastics and achieves a high sensitivity and high resolution. Such so-called metal resist compositions, however, suffer from many problems including low solubility in resist solvents, poor shelf stability, and defectiveness due to post-etching residues. Further, the metal resist compositions are of negative tone wherein the exposed region becomes a metal oxide which is insoluble in the developer. In their application to the patterning of contact holes, an additional reversal step is necessary, leaving an economical concern.

CITATION LIST

Patent Document 1: JP-A 2018-005224 (U.S. Pat. No. 10,323,113)

Patent Document 2: JP-A 2021-503482

Patent Document 3: JP-A 2015-180928 (U.S. Pat. No. 9,563,123)

Patent Document 4: JP-A 2018-095853

Non-Patent Document 1: SPIE Vol. 5039 p 1 (2003)

Non-Patent Document 2: SPIE Vol. 6520 p 65203L-1 (2007)

SUMMARY OF THE INVENTION

An object of the invention is to provide a resist composition which exhibits a high sensitivity and resolution when processed by photolithography using high-energy radiation, typically EB and EUV lithography, and a patterning process using the same.

The inventors have found that a resist composition based on a hypervalent iodine compound having at least two acyloxy groups and a carboxylic acid has a very high sensitivity, forms a resist film having a satisfactory resolution, and is thus quite useful in precise micropatterning.

In one aspect, the invention provides a resist composition comprising a hypervalent iodine compound having at least two acyloxy groups, a carboxylic acid, and a solvent.

In a preferred embodiment, the hypervalent iodine compound has the formula (1):

(1)

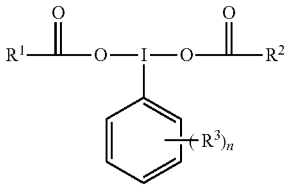

wherein n is an integer of 0 to 5, $R^1$ and $R^2$ are each independently halogen or a $C_1$-$C_{10}$ hydrocarbyl group which may contain a heteroatom, $R^1$ and $R^2$ may bond together to form a ring with the carbon atoms to which they are attached and the intervenient atoms, and $R^3$ is halogen or a $C_1$-$C_{40}$ hydrocarbyl group which may contain a heteroatom, when n is an integer of 2 to 5, a plurality of $R^3$ may be the same or different.

In a preferred embodiment, the carboxylic acid has the formula (2):

(2)

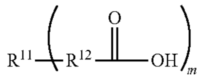

wherein m is an integer of 1 to 4, $R^{11}$ is a $C_1$-$C_{40}$ m-valent hydrocarbon group or $C_2$-$C_{40}$ m-valent heterocyclic group, when m is 2, $R^{11}$ may be an ether bond, carbonyl group, azo group, thioether bond, carbonate bond, carbamate bond, sulfinyl group or sulfonyl group, and some or all of the hydrogen atoms in the m-valent hydrocarbon group or m-valent heterocyclic group may be substituted by a heteroatom-containing moiety, and some constituent $-CH_2-$ in the m-valent hydrocarbon group may be replaced by a heteroatom-containing moiety, $R^{12}$ is a single bond or $C_1$-$C_{10}$ hydrocarbylene group, and some or all of the hydrogen atoms in the hydrocarbylene group may be substituted by a heteroatom-containing moiety, and some constituent $-CH_2-$ in the hydrocarbylene group may be replaced by a heteroatom-containing moiety, and when m is an integer of 2 to 4, a plurality of $R^{12}$ may be the same or different.

More preferably, m is an integer of 2 to 4.

In another aspect, the invention provides a pattern forming process comprising the steps of applying the resist composition defined herein onto a substrate to form a resist film thereon, exposing the resist film to high-energy radiation, and developing the exposed resist film in a developer.

Typically, the developer is an organic solvent.

Most often, the high-energy radiation is EB or EUV.

Advantageous Effects of Invention

The resist composition exhibits both high sensitivity and resolution when processed by EB and EUV lithography and is quite useful in micropatterning.

DETAILED DESCRIPTION OF THE INVENTION

The terms "a" and "an" herein do not denote a limitation of quantity, but rather denote the presence of at least one of the referenced item. As used herein, the notation ($C_n$-$C_m$) means a group containing from n to m carbon atoms per group.

The abbreviations and acronyms have the following meaning.

UV: ultraviolet radiation
EUV: extreme ultraviolet
EB: electron beam
Mw: weight average molecular weight
PAB: post-apply bake
PEB: post-exposure bake
LWR: line width roughness
CDU: critical dimension uniformity

Resist Composition

One embodiment of the invention is a resist composition based on a hypervalent iodine compound having at least two acyloxy groups and a carboxylic acid.

Hypervalent Iodine Compound

The hypervalent iodine compound is a general term for iodine compounds having valence electrons beyond the octet rule formally. The hypervalent iodine compound used herein is not particularly limited as long as it has at least two acyloxy groups. Exemplary are three-coordinate iodine compounds having an oxidation number of +3 and five-coordinate iodine compounds having an oxidation number of +5.

The preferred hypervalent iodine compound is a three-coordinate hypervalent iodine compound having the formula (1).

(1)

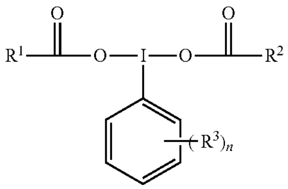

In formula (1), n is an integer of 0 to 5.

In formula (1), $R^1$ and $R^2$ are each independently halogen or a $C_1$-$C_{10}$ hydrocarbyl group which may contain a heteroatom. Also, $R^1$ and $R^2$ may bond together to form a ring with the carbon atoms to which they are attached and the intervenient atoms. Suitable halogen atoms include fluorine, chlorine, bromine and iodine. The $C_1$-$C_{10}$ hydrocarbyl group may be saturated or unsaturated and straight, branched or cyclic. Examples thereof include $C_1$-$C_{10}$ alkyl groups such as methyl, ethyl, n-propyl, isopropyl, n-butyl, sec-butyl, tert-butyl, n-pentyl, tert-pentyl, n-hexyl, n-octyl, 2-ethylhexyl, n-nonyl, and n-decyl, $C_3$-$C_{10}$ cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, tricyclo[5.2.1.$0^{2,6}$]decanyl, and adamantyl, alkenyl groups such as vinyl and allyl, $C_6$-$C_{10}$ aryl groups such as phenyl and naphthyl, and combinations thereof. Also included are hydrocarbyl groups in which some or all of the hydrogen atoms are substituted by a moiety containing a heteroatom such as oxygen, sulfur, nitrogen or halogen, and some constituent —$CH_2$— is replaced by a moiety containing a heteroatom such as oxygen, sulfur or nitrogen, so that the group may contain hydroxy, cyano, halogen, carbonyl, ether bond, thioether bond, ester bond, sulfonic ester bond, carbonate bond, carbamate bond, lactone ring, sultone ring, or carboxylic anhydride (—C(═O)—O—C(═O)—). $R^1$ and $R^2$ are preferably $C_1$-$C_4$ hydrocarbyl groups.

In formula (1), $R^3$ is halogen or a $C_1$-$C_{40}$ hydrocarbyl group which may contain a heteroatom. When n is an integer of 2 to 5, a plurality of $R^3$ may be the same or different. Suitable halogen atoms include fluorine, chlorine, bromine and iodine. The $C_1$-$C_{40}$ hydrocarbyl group may be saturated or unsaturated and straight, branched or cyclic. Examples thereof include $C_1$-$C_{40}$ alkyl groups such as methyl, ethyl, propyl, isopropyl, n-butyl, sec-butyl, tert-butyl, n-pentyl, tert-pentyl, n-hexyl, n-octyl, 2-ethylhexyl, n-nonyl, and n-decyl, $C_3$-$C_{40}$ cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, tricyclo[5.2.1.$0^{2,6}$]decanyl, adamantyl, and adamantylmethyl, and $C_6$-$C_{40}$ aryl groups such as phenyl, naphthyl, and anthracenyl. Also included are hydrocarbyl groups in which some or all of the hydrogen atoms are substituted by a moiety containing a heteroatom such as oxygen, sulfur, nitrogen or halogen, and some constituent —$CH_2$— is replaced by a moiety containing a heteroatom such as oxygen, sulfur or nitrogen, so that the group may contain hydroxy, cyalo, halogen, carbonyl, ether bond, thioether bond, ester bond, sulfonic ester bond, carbonate bond, carbamate bond, lactone ring, sultone ring, or carboxylic anhydride (—C(═O)—O—C(═O)—).

Examples of the hypervalent iodine compound having formula (1) are shown below, but not limited thereto.

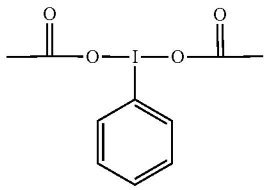

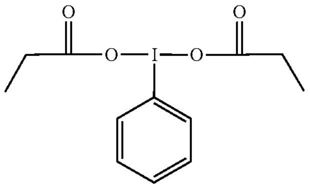

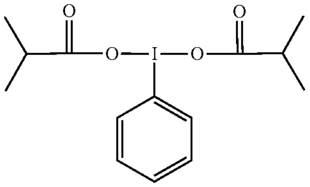

-continued

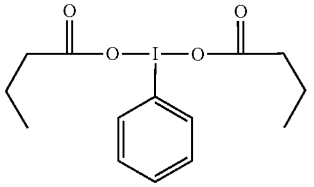

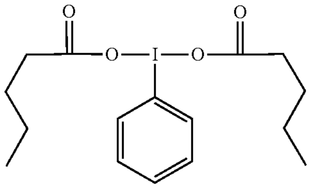

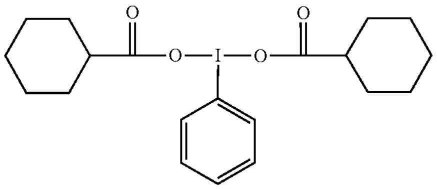

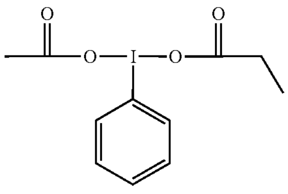

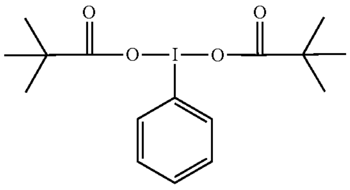

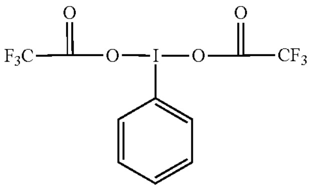

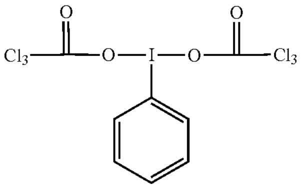

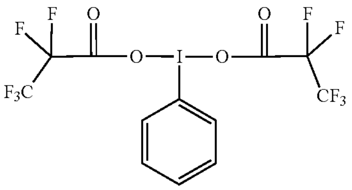

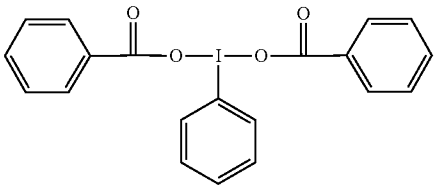

-continued
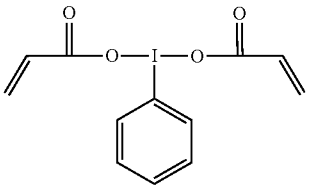
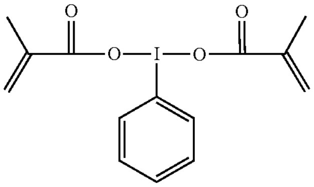
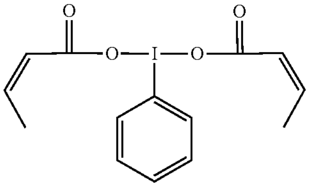
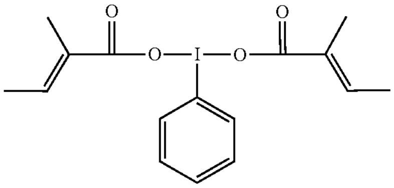
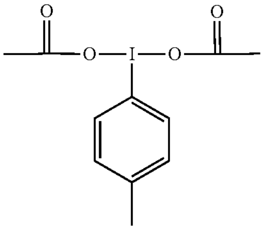
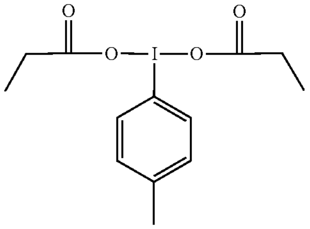
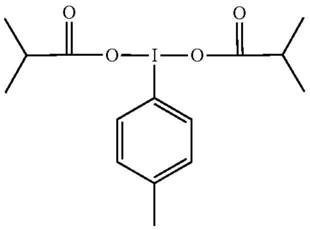
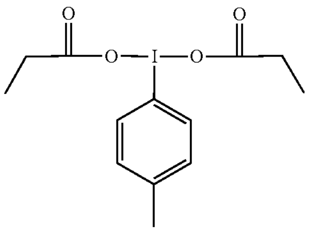
-continued
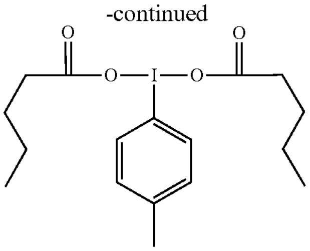
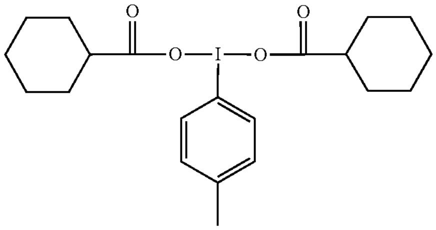
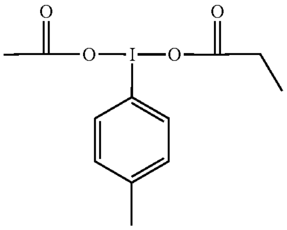
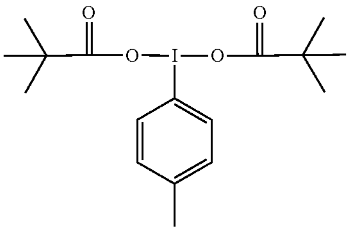
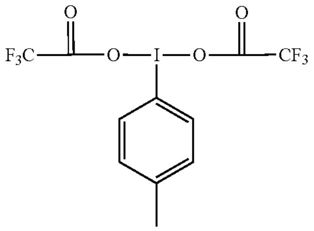
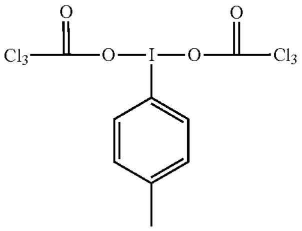
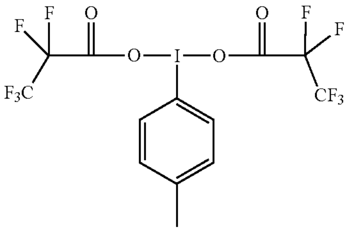

-continued
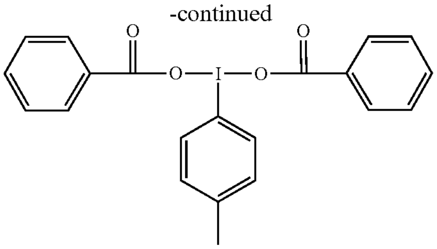
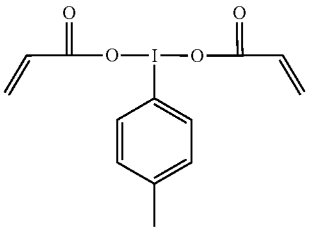
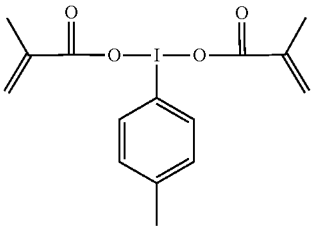
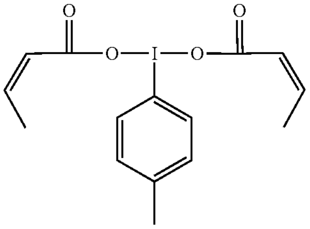
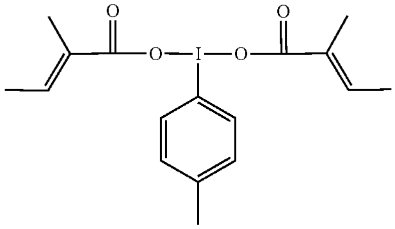
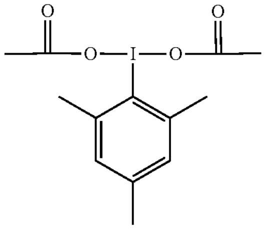
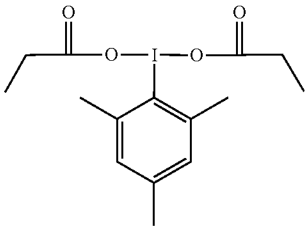
-continued
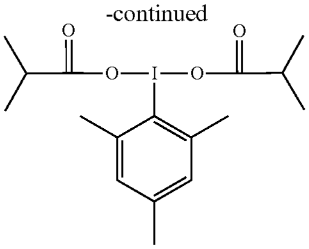
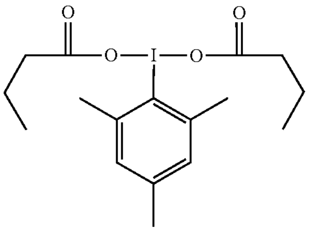
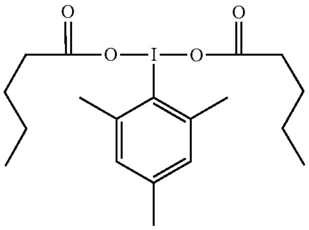
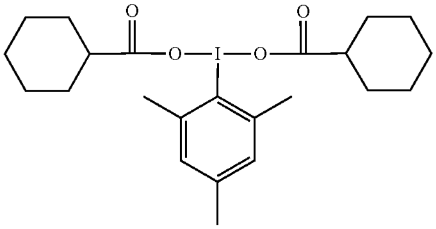
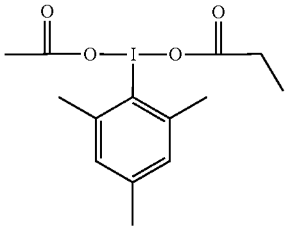
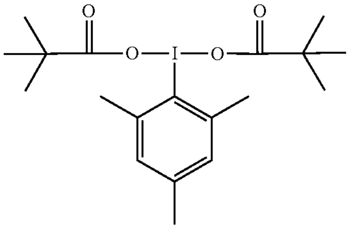
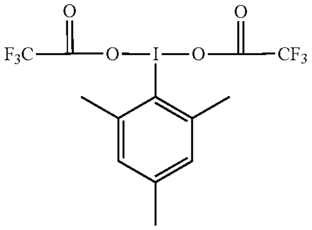

-continued
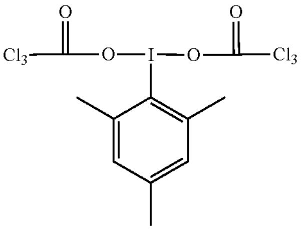
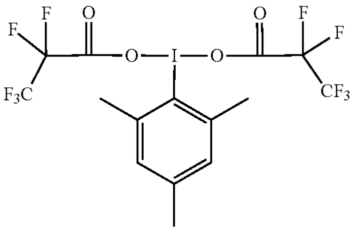
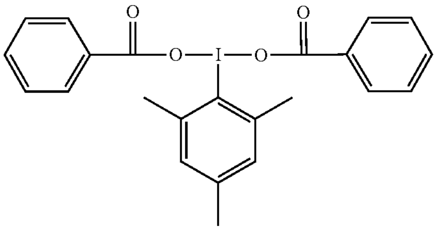
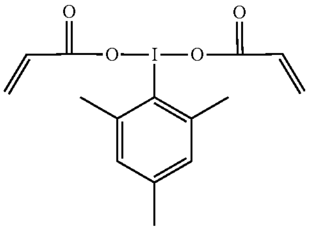
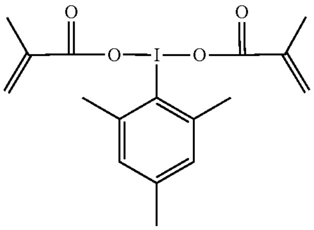
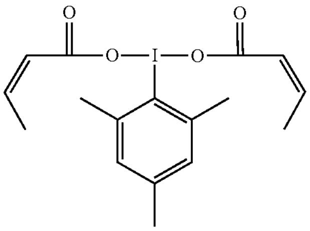
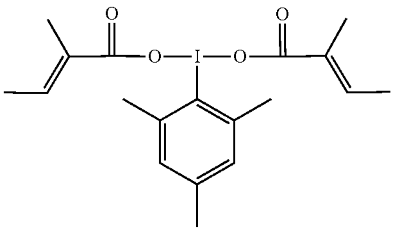
-continued
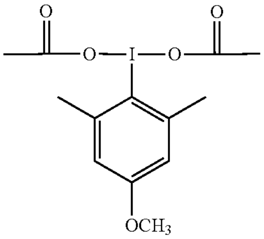
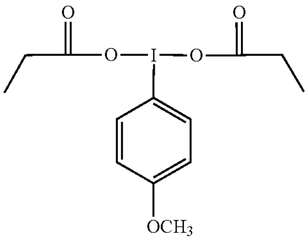
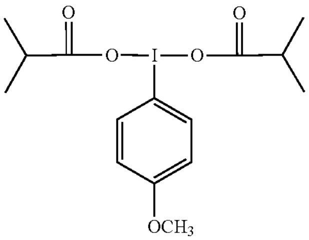
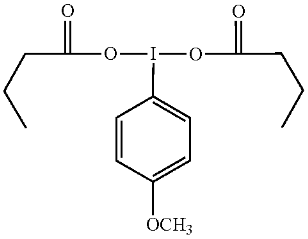
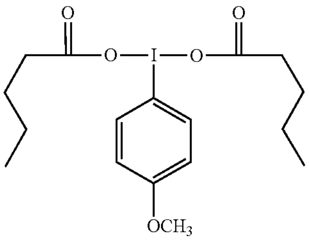
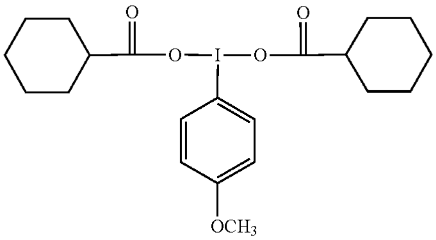
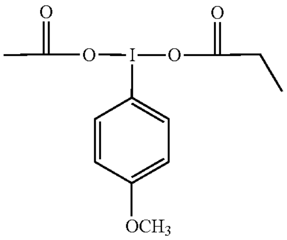

-continued
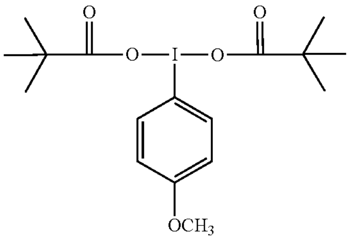
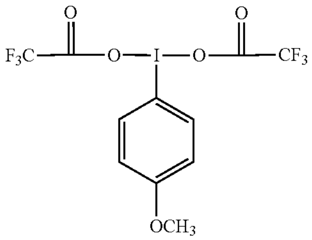
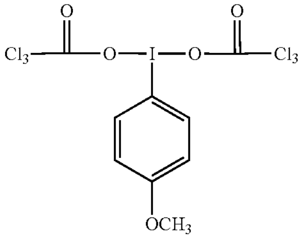
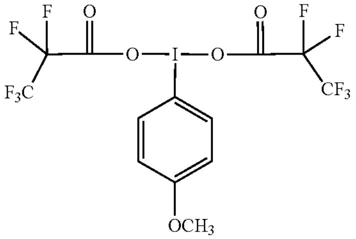
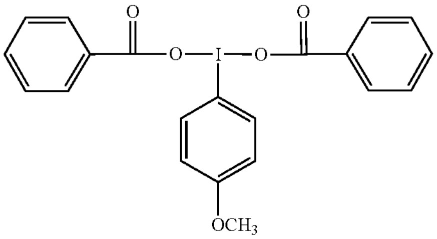
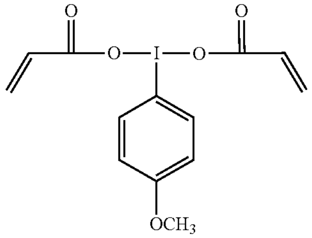
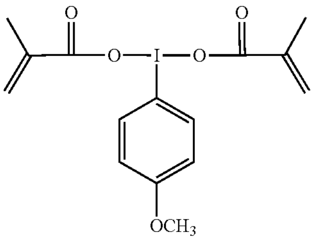
-continued
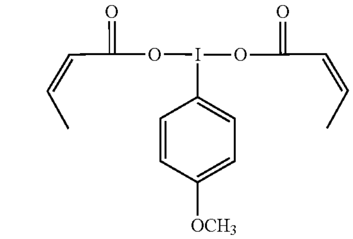
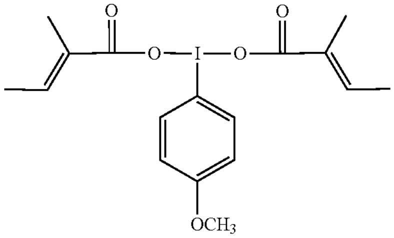
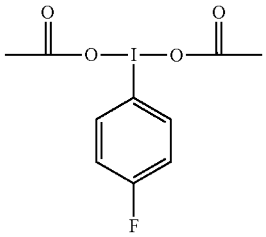
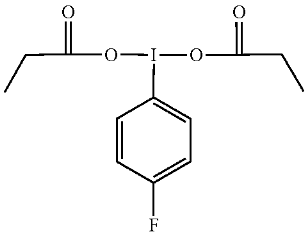
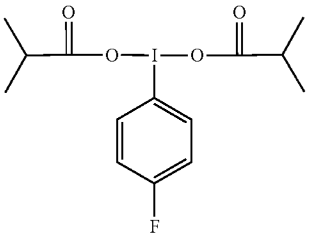
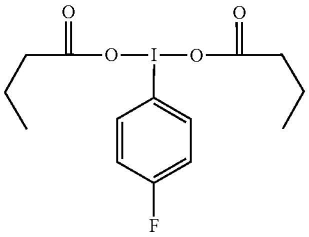
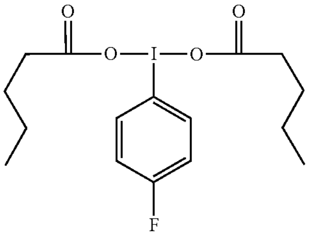

-continued
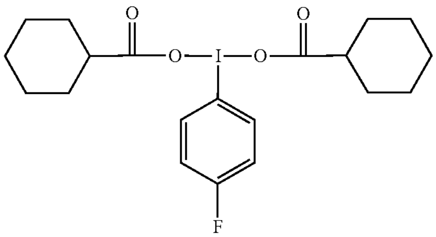
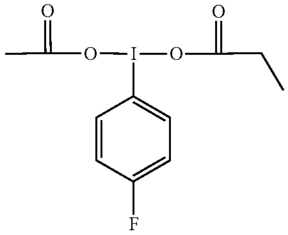
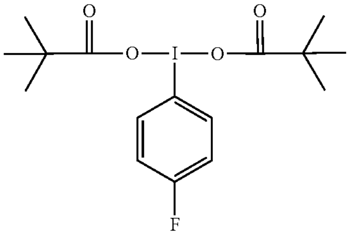
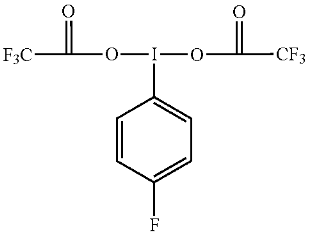
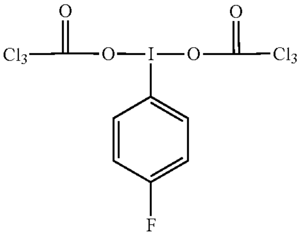
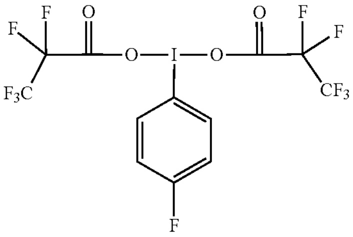
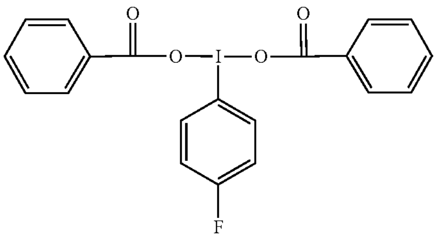
-continued
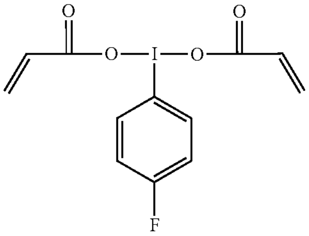
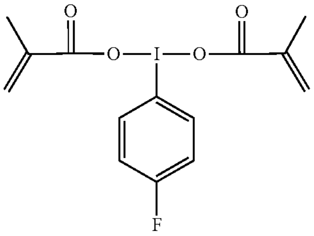
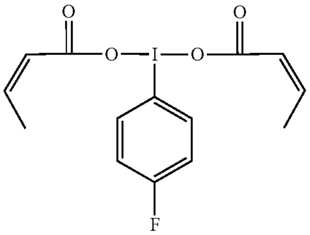
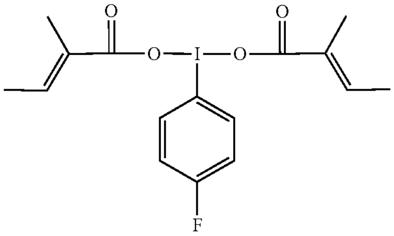
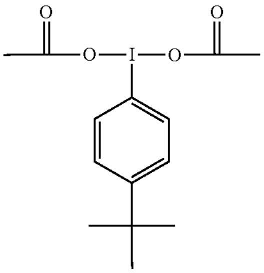
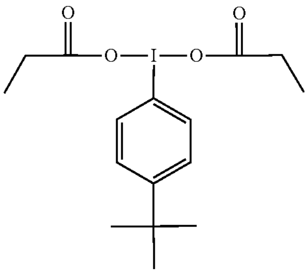

-continued
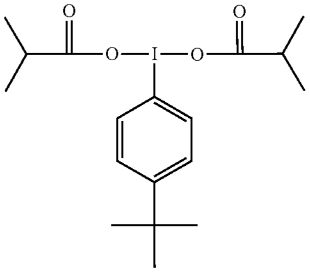
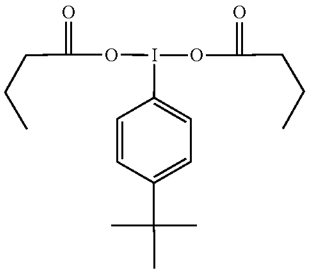
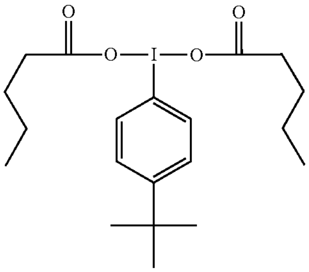
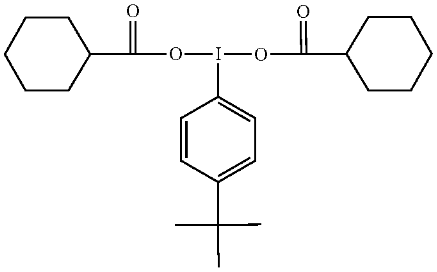
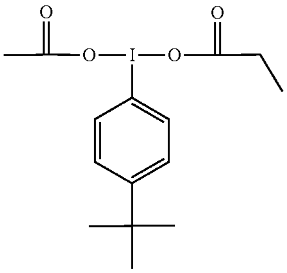
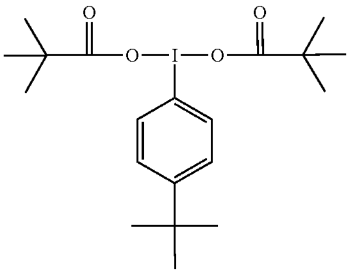
-continued
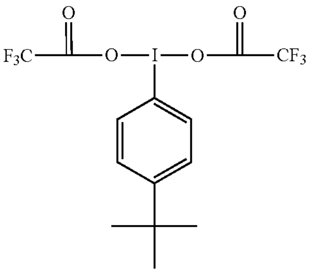
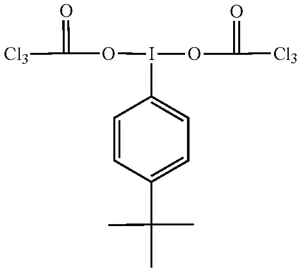
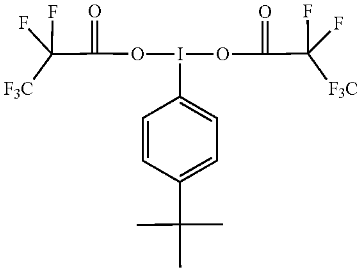
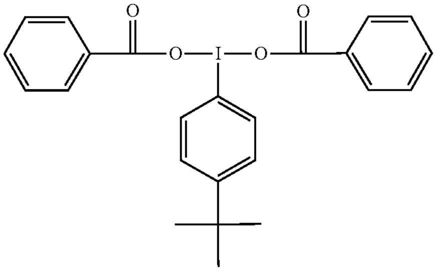
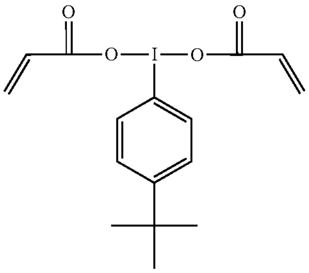
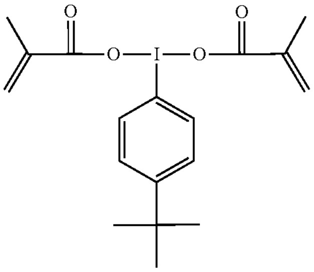

-continued

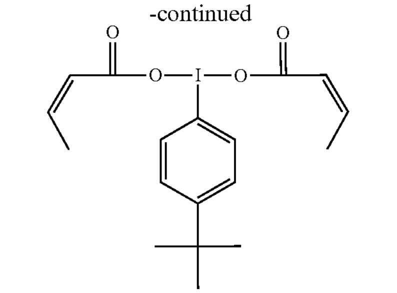

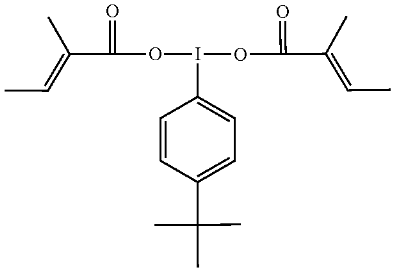

Carboxylic Acid

As the carboxylic acid used herein, all compounds which are generally defined as carboxylic acid in the organic chemistry field are applicable. A carboxylic acid having the formula (2) is preferred.

(2)

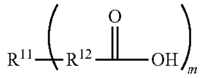

In formula (2), m is an integer of 1 to 4. $R^{11}$ is a $C_1$-$C_{40}$ m-valent hydrocarbon group or $C_2$-$C_{40}$ m-valent heterocyclic group. When m is 2, $R^{11}$ may be an ether bond, carbonyl group, azo group, thioether bond, carbonate bond, carbamate bond, sulfinyl group or sulfonyl group, and some or all of the hydrogen atoms in the m-valent hydrocarbon group or m-valent heterocyclic group may be substituted by a heteroatom-containing moiety, and some constituent —$CH_2$— in the m-valent hydrocarbon group may be replaced by a heteroatom-containing moiety. $R^{12}$ is a single bond or $C_1$-$C_{10}$ hydrocarbylene group, and some or all of the hydrogen atoms in the hydrocarbylene group may be substituted by a heteroatom-containing moiety, and some constituent —$CH_2$— in the hydrocarbylene group may be replaced by a heteroatom-containing moiety. When m is an integer of 2 to 4, a plurality of $R^{12}$ may be the same or different.

The m-valent hydrocarbon group represented by $R^{11}$ may be saturated or unsaturated and straight, branched or cyclic. The m-valent hydrocarbon group is obtained by removing m number of hydrogen atoms from a hydrocarbon. Suitable hydrocarbons include $C_1$-$C_{40}$ alkanes, $C_2$-$C_{40}$ alkenes, $C_2$-$C_{40}$ alkynes, $C_3$-$C_{40}$ cyclic saturated hydrocarbons, $C_3$-$C_{40}$ cyclic unsaturated hydrocarbons, and $C_6$-$C_{40}$ aromatic hydrocarbons.

Exemplary $C_1$-$C_{40}$ alkanes include methane, ethane, propane, butane, pentane, hexane, heptane, octane, nonane, decane, and structural isomers thereof.

Exemplary $C_2$-$C_{40}$ alkenes include ethylene, propylene, butene, pentene, hexene, heptene, octene, nonene, decene, and structural isomers thereof.

Exemplary $C_2$-$C_{40}$ alkynes include acetylene, propyne, butyne, pentyne, hexyne, heptyne, octyne, nonyne, decyne, and structural isomers thereof.

Exemplary $C_3$-$C_{40}$ cyclic saturated hydrocarbons include cyclopropane, cyclobutane, cyclohexane, cycloheptane, cyclooctane, adamantane, and norbornane.

Exemplary $C_3$-$C_{40}$ cyclic unsaturated hydrocarbons include cyclopropene, cyclobutene, cyclopentene, cyclohexene, cycloheptene, cyclooctene, and norbornene.

Exemplary $C_6$-$C_{40}$ aromatic hydrocarbons include benzene, naphthalene, and biphenyl.

The m-valent heterocyclic group represented by $R^{11}$ is obtained by removing m number of hydrogen atoms from a heterocyclic compound. Suitable heterocyclic compounds include furane, pyridine, pyrazole, and thiazolidine.

In the m-valent hydrocarbon group and m-valent heterocyclic group, some or all of the hydrogen atoms may be substituted by a moiety containing a heteroatom such as oxygen, sulfur, nitrogen or halogen, so that the group may contain hydroxy, cyano, fluorine, chlorine, bromine, or iodine. In the m-valent hydrocarbon group, some constituent —$CH_2$— may be replaced by a moiety containing a heteroatom such as oxygen, sulfur or nitrogen, so that the group may contain carbonyl, ether bond, thioether bond, ester bond, sulfonic ester bond, carbonate bond, carbamate bond, lactone ring, sultone ring, or carboxylic anhydride (—C(=O)—O—C(=O)—).

The hydrocarbylene group represented by $R^{12}$ may be saturated or unsaturated and straight, branched or cyclic. Examples thereof include $C_1$-$C_{10}$ alkanediyl groups such as methanediyl, ethane-1,1-diyl, ethane-1,2-diyl, propane-1,2-diyl, propane-1,3-diyl, butane-1,4-diyl, pentane-1,5-diyl, hexane-1,6-diyl, heptane-1,7-diyl, octane-1,8-diyl, nonane-1,9-diyl, and decane-1,10-diyl, $C_3$-$C_{10}$ cyclic saturated hydrocarbylene groups such as cyclopentanediyl, cyclohexanediyl, norbornanediyl, and adamantanediyl, $C_2$-$C_{10}$ unsaturated aliphatic hydrocarbylene groups such as vinylene and propene-1,3-diyl, $C_6$-$C_{10}$ arylene groups such as phenylene and naphthylene, and combinations thereof. In the hydrocarbylene group, some or all of the hydrogen atoms may be substituted by a moiety containing a heteroatom such as oxygen, sulfur, nitrogen or halogen, and some constituent —$CH_2$— may be replaced by a moiety containing a heteroatom such as oxygen, sulfur or nitrogen, so that the group may contain hydroxy, cyano, fluorine, chlorine, bromine, iodine, carbonyl, ether bond, thioether bond, ester bond, sulfonic ester bond, carbonate bond, carbamate bond, lactone ring, sultone ring, or carboxylic anhydride.

Of the carboxylic acids, those compounds of formula (2) wherein in is an integer of 2 to 4 are preferred because when mixed with the hypervalent iodine compound, they form a high molecular weight, robust resist film having etching resistance and developer resistance.

Examples of the carboxylic acid are shown below, but not limited thereto.

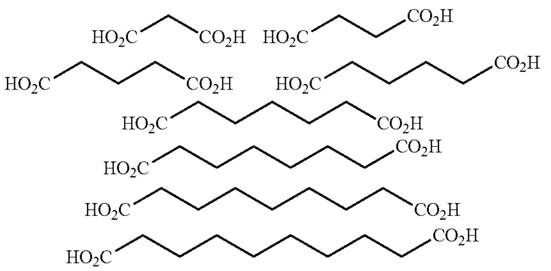

-continued

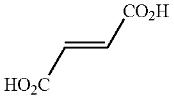
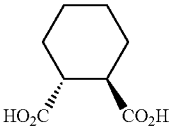
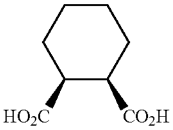
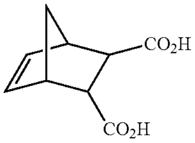
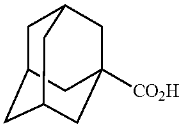
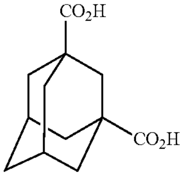
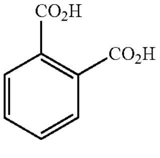
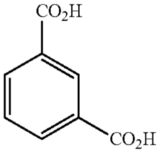
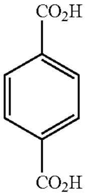
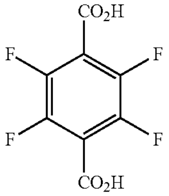
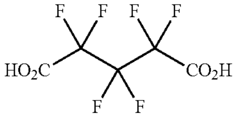
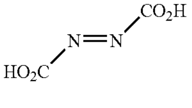
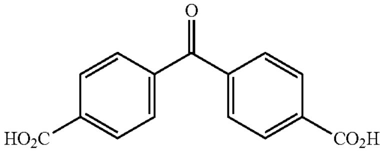
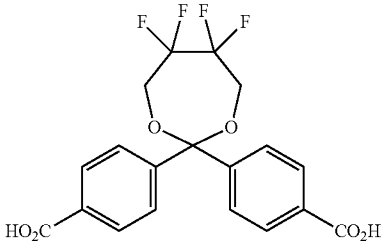
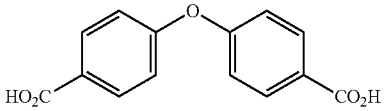
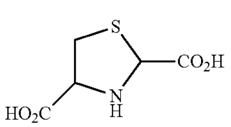
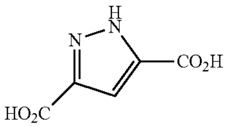
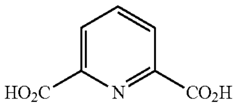
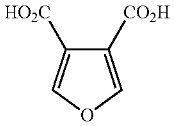
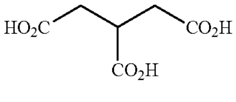
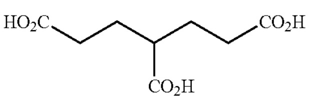
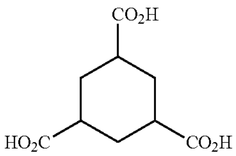

-continued

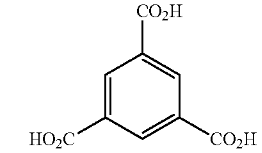
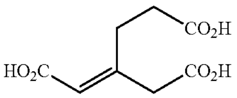
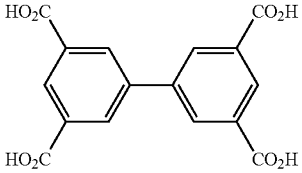
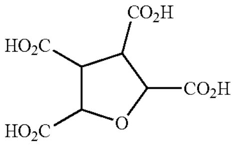
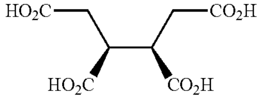
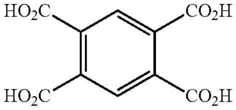
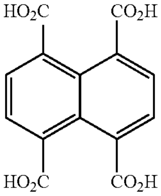
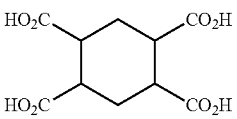
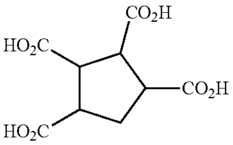

In the resist composition, the hypervalent iodine compound and the carboxylic acid are preferably present in a molar ratio of from 10:90 to 90:10, more preferably from 20:80 to 80:20, even more preferably from 30:70 to 70:30.

Organic Solvent

The resist composition further contains an organic solvent. The organic solvent is not particularly limited as long as the hypervalent iodine compound and the carboxylic acid are dissolvable therein and a film can be formed from the resulting solution. Suitable organic solvents include ketones such as cyclohexanone, methyl 2-n-pentyl ketone, and methyl isoamyl ketone; alcohols such as 3-methoxybutanol, 3-methyl-3-methoxybutanol, 1-methoxy-2-propanol, 1-ethoxy-2-propanol, diacetone alcohol, and 4-methyl-2-pentanol; ethers such as propylene glycol monomethyl ether, ethylene glycol monomethyl ether, propylene glycol monoethyl ether, ethylene glycol monomethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate: carboxylic acids such as formic acid, acetic acid, and propionic acid: lactones such as γ-butyronitrile, and mixtures thereof.

The organic solvent is preferably present in such amounts that the resist composition may have a solids concentration of 0.1 to 20% by weight, more preferably 0.1 to 15% by weight, even more preferably 0.1 to 10% by weight. As used herein, the term solids is a general term for all components in the resist composition excluding the solvent.

Other Components

The resist composition may further contain a surfactant as another component. The surfactant is preferably selected from fluorochemical and silicone-based surfactants. Exemplary surfactants are described, for example, in US 2008/0248425, paragraph [0276]. Also useful are surfactants other than the fluorochemical and silicone-based surfactants, as described, for example, in US 2008/0248425, paragraph [0280]. When used, the surfactant is preferably present in an amount of 0.0001 to 2% by weight based on the overall solids. The surfactant may be used alone or in admixture.

The resist composition may further contain a radical scavenger (or radical trapping agent) as an additional component. When added, the radical scavenger is effective for controlling photo-reaction and adjusting sensitivity during photolithography.

Suitable radical scavengers include hindered phenols, quinones, hindered amines, and thiol compounds. Exemplary hindered phenols include dibutylhydroxytoluene (BHT) and 2,2'-methylenebis(4-methyl-6-tert-butylphenol). Exemplary quinones include 4-methoxyphenol (or methoquinone) and hydroquinone. Exemplary hindered amines include 2,2,6,6-tetramethylpyperidine and 2,2,6,6-tetamethylpyperidine-N-oxyradical. Exemplary thiol compounds include dodecanethiol and hexadecanethiol. When used, the radical scavenger is preferably present in an amount of 0.01 to 10% by weight based on the overall solids. The radical scavenger may be used alone or in admixture.

The resist composition contains the hypervalent iodine compound and the carboxylic acid as main components, but not a base polymer containing an acid labile group and a photoacid generator as used in conventional chemically amplified resist compositions. Nevertheless, this resist composition works such that the region thereof exposed to EB or EUV turns soluble in the developer to form a positive tone pattern. Although its mechanism is not well understood, the following mechanism is presumed.

The hypervalent iodine compound is a three-coordinate compound having bonded thereto an aryl group and two carboxylate ligands as represented by formula (1). When such a three-coordinate iodine compound is mixed with a carboxylic acid, replacement of carboxylate ligands takes place as equilibration reaction. If the original carboxylate ligands are removed by any suitable means, a hypervalent iodine compound having new ligands is created. For example, if iodobenzene diacetate which is relatively readily available as the hypervalent iodine compound is mixed with a carboxylic acid having a high molecular weight, and the resulting low-boiling acetic acid is removed, then ligand exchange is completed. If the ligand has a fully high molecular weight, then a robust resist film is formed. Particularly when the carboxylic acid has a plurality of carboxy groups, for example, a dicarboxylic acid is used, a high molecular weight compound of polyester structure having the hypervalent iodine compound is formed. This ensures film formability and satisfactory developer resistance.

The combined form of hypervalent iodine compound and carboxylic acid is formed during film preparation. That is, by removing a low-molecular-weight carboxylic acid formed during film formation and subsequent bake step, ligand exchange reaction is completed and a resist film is formed.

The resist film obtained from the inventive resist composition is extremely low in organic solvent solubility. Presumably this is attributed to the iodine compound having substantial polarization. However, as the iodine compound is decomposed with light, the film becomes soluble in the organic solvent and the resist composition functions in positive tone. Alternatively, if the photo-decomposed product is a low-molecular-weight component, the exposed region can be volatilized off. That is, patterning without using the developer is possible.

From the foregoing presumption, the inventive resist composition is regarded as falling in the concept of resist composition. Using the inventive resist composition, a small size pattern can be resolved without image blur due to acid diffusion as found in conventional chemically amplified resist compositions (i.e., compositions comprising a base polymer and a photoacid generator).

The inventive resist composition is quite effective in the EUV lithography. This is because an iodine atom having a high absorptivity to EUV radiation is included. That is, shot noise is reduced, and higher resolution and lower LWR are achievable.

As the EUV lithography resist composition capable of forming a small size pattern, a metal resist composition based on a metal (specifically tin) compound having a high absorptivity to EUV radiation like iodine atom is known, for example, from Patent Document 2. However, the metal resist composition suffers from many problems including a lack of solvent solubility, poor shelf stability, and defects in the form of post-etching residues due to the containment of metal elements, as discussed previously. In contrast, since the inventive resist composition does not use metal elements, it is advantageous in defectiveness over the metal resist and eliminates the problem of solvent solubility. Using the inventive resist composition, a positive tone pattern is formed without development or through organic solvent development. In the step of forming contact holes, for example, the reversal processing step as conducted in negative tone development is unnecessary. From these aspects, the inventive resist composition is regarded more useful than the metal resist composition.

Patent Documents 3 and 4 describe a resist composition comprising a hypervalent iodine compound as an additive and a resist composition comprising a base polymer having a hypervalent iodine compound incorporated in its framework. It is described in these patent documents that these resist compositions are successful only in improving line edge roughness. They refer nowhere to a possibility of photo-decomposition of the hypervalent iodine compound and an ability to function as a non-chemically amplified resist. In these resist compositions, the hypervalent iodine compound is not a main component. It is then believed that a material capable of reducing shot noise during the EUV lithography and forming a small size pattern as the non-chemically amplified resist is not conceivable from these patent documents. That is, the present invention provides a definitely novel resist composition and pattern forming process.

Pattern Forming Process

When the resist composition is used in the fabrication of various integrated circuits, any well-known lithography techniques are applicable. For example, the invention provides a pattern forming process comprising the steps of applying the resist composition onto a substrate to form a resist film thereon, exposing the resist film to high-energy radiation, and optionally developing the exposed resist film in a developer.

First, the resist composition is applied onto a substrate for integrated circuit fabrication (e.g., Si, $SiO_2$, SiN, SiON, TiN, WSi, BPSG, SOG, or organic antireflective coating) or a substrate for mask circuit fabrication (e.g., Cr, CrO, CrON, $MoSi_2$, or $SiO_2$) by any suitable technique such as spin coating, roll coating, flow coating, dip coating, spray coating or doctor coating. The coating is prebaked (PAB) on a hot plate at a temperature of preferably 60 to 200° C. for 10 seconds to 30 minutes, more preferably at 80 to 180° C. for 30 seconds to 20 minutes to form a resist film having a thickness of 0.01 to 2 μm.

Next the resist film is exposed to high-energy radiation. The radiation is selected from among UV, deep UV, EB, EUV, X-ray, soft X-ray, excimer laser radiation, γ-ray, and synchrotron radiation. On use of UV, deep UV, EUV, X-ray, soft X-ray, excimer laser radiation, γ-ray, and synchrotron radiation as the high-energy radiation, the resist film is exposed thereto directly or through a mask having the desired pattern so as to reach a dose of preferably about 1 to 300 mJ/$cm^2$, more preferably about 10 to 200 mJ/$cm^2$. On use of EB as the high-energy radiation, imagewise writing is performed directly or through a mask having the desired pattern so as to reach a dose of preferably about 0.1 to 2,000 μC/$cm^2$, more preferably about 0.5 to 1,500 μC/$cm^2$. The resist composition is best suited in micropatterning using EB or EUV as the high-energy radiation.

If necessary, the resist film is post-exposure baked (PEB). Preferably PEB is performed on a hot plate or in an oven at 30 to 120° C. for 10 seconds to 30 minutes, more preferably at 60 to 100° C. for 30 seconds to 20 minutes.

After the exposure or PEB, the resist film is developed in a developer to form a pattern, if necessary. In the practice of the invention, the exposed region of the resist film is solubilized through organic solvent development to form a positive tone pattern. The organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, isopropyl alcohol, n-butanol, n-pentanol, propyl acetate, butyl acetate, isobutyl acetate, pentyl acetate, isopentyl acetate, butenyl acetate, propyl formate, butyl formate, isobutyl formate, pentyl formate, isopentyl formiate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, ethyl phenylacetate, benzyl formate, phenylethyl formate, methyl 3-phenylpropionate, benzyl propionate, 2-phenylethyl acetate, 2-propanol, 3-methoxybutanol, 3-methyl-3-methoxybutanol, 1-methoxy-2-propanol, 1-ethoxy-2-propanol, diacetone alcohol, and 4-methyl-2-pentanol. These organic solvents may be used alone or in admixture of two or more.

At the end of development, the resist film is rinsed if necessary. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents.

Rinsing is effective for preventing the resist pattern from collapse or reducing defect formation. Rinsing is not essential. By omitting rinsing, the amount of the solvent used is saved.

EXAMPLES

Examples of the invention are given below by way of illustration and not by way of limitation. The abbreviation "pbw" is parts by weight.

[1] Preparation of Resist Composition

Examples 1-1 to 1-15 and Comparative Examples 1-1 to 1-3

Resist compositions (R-01 to R-15) were prepared by dissolving a hypervalent iodine compound and a carboxylic acid in a solvent in accordance with the recipe shown in Table 1, and filtering the solution through a Teflon® filter having a pore size of 0.2 μm.

Separately, comparative resist compositions (CR-01 to CR-03) were prepared by mixing a base polymer, photoacid generator, sensitivity modifier, and solvent containing 0.01 wt % of surfactant (PF-636 by Omnova Solutions Inc.) in accordance with the recipe shown in Table 2, and filtering the solution through a Teflon® filter having a pore size of 0.2 μm.

TABLE 1

| | | Resist composition | Hypervalent iodine compound (pbw) | Carboxylic acid (pbw) | Solvent 1 (pbw) | Solvent 2 (pbw) |
|---|---|---|---|---|---|---|
| Example | 1-1 | R-01 | I-1 (11.5) | CA-1 (12.8) | PGMEA (900) | AcOH (100) |
| | 1-2 | R-02 | I-1 (11.5) | CA-2 (4.2) | PGMEA (900) | AcOH (100) |
| | 1-3 | R-03 | I-1 (11.5) | CA-3 (4.1) | PGMEA (900) | AcOH (100) |
| | 1-4 | R-04 | I-1 (11.5) | CA-4 (5.2) | PGMEA (900) | AcOH (100) |
| | 1-5 | R-05 | I-1 (11.5) | CA-5 (5.9) | PGMEA (900) | AcOH (100) |
| | 1-6 | R-06 | I-1 (11.5) | CA-6 (8.5) | PGMEA (900) | AcOH (100) |
| | 1-7 | R-07 | I-1 (11.5) | CA-7 (8.6) | PGMEA (900) | AcOH (100) |
| | 1-8 | R-08 | I-1 (11.5) | CA-8 (4.1) | PGMEA (900) | AcOH (100) |
| | 1-9 | R-09 | I-1 (11.5) | CA-9 (5.1) | PGMEA (900) | AcOH (100) |
| | 1-10 | R-10 | I-1 (11.5) | CA-10 (5.3) | PGMEA (900) | AcOH (100) |
| | 1-11 | R-11 | I-2 (15.4) | CA-4 (5.2) | PGMEA (900) | AcOH (100) |
| | 1-12 | R-12 | I-3 (13.0) | CA-5 (5.9) | PGMEA (900) | GBL (100) |
| | 1-13 | R-13 | I-1 (17.5) | CA-4 (5.2) | PGMEA (900) | AcOH (100) |
| | 1-14 | R-14 | I-1 (11.5) | CA-4 (7.7) | PGMEA (900) | AcOH (100) |
| | 1-15 | R-15 | I-1 (5.8)/ I-3 (6.5) | CA-5 (5.9) | PGMEA (900) | AcOH (100) |

TABLE 2

| | | Resist composition | Polymer (pbw) | PAG (pbw) | Sensitivity modifier (pbw) | Solvent 1 (pbw) | Solvent 2 (pbw) |
|---|---|---|---|---|---|---|---|
| Comparative Example | 1-1 | CR-01 | P-1 (80) | PAG-1 (19.0) | Q-1 (6.2) | PGMEA (1890) | GBL (210) |
| | 1-2 | CR-02 | P-1 (80) | PAG-2 (21.0) | Q-1 (6.2) | PGMEA (1890) | GBL (210) |
| | 1-3 | CR-03 | P-1 (80) | PAG-1 (19.0) | Q-2 (8.7) | PGMEA (1890) | GBL (210) |

In Table 1, the hypervalent iodine compound (I-1 to I-3), carboxylic acid (CA-1 to CA-10) and solvent are identified below.

I-1

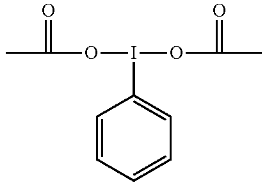

I-2

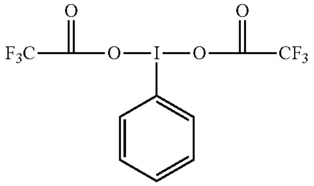

I-3

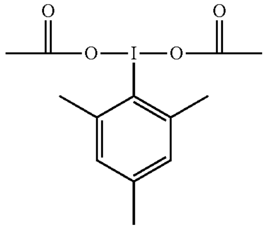

CA-1

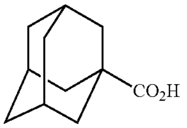

CA-2

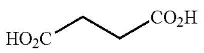

CA-3

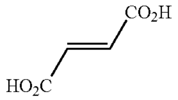

CA-4

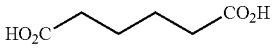

CA-5

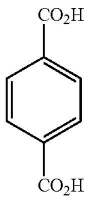

-continued

CA-6

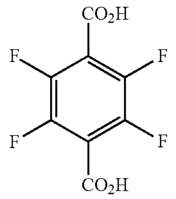

CA-7

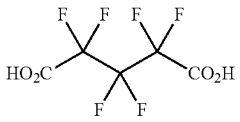

CA-8

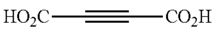

CA-9

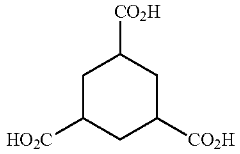

CA-10

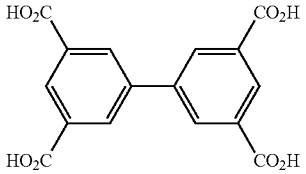

Solvent:

PGMEA (propylene glycol monomethyl ether acetate)

AcOH (acetic acid)

GBL (γ-butyrolactone)

In Table 2, the base polymer (P-1), photoacid generator (PAG-1, PAG-2), and sensitivity modifier (Q-1, Q-2) are identified below.

P-1

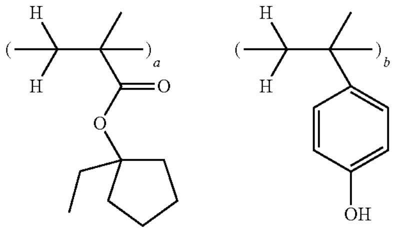

(a = 0.60, b = 0.40)

Mw=8,755 (Vs. Polystyrene Standards), Mw/Mn=1.94

PAG-1

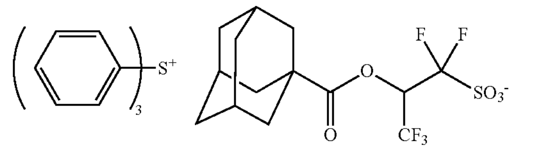

PAG-2

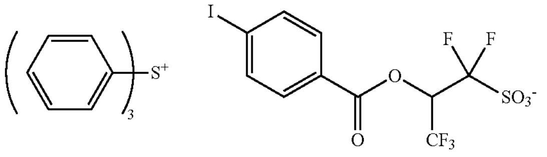

Q-1

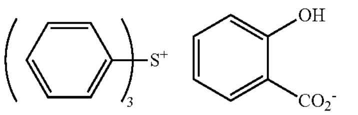

Q-2

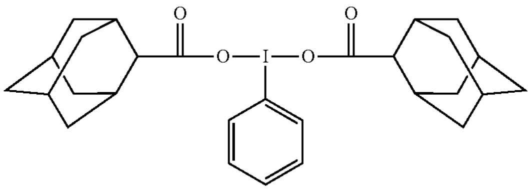

[2] EUV Lithography Test (Line-and-Space Pattern)

Examples 2-1 to 2-15 and Comparative Examples 2-1 to 2-3

Each of the resist compositions (R-01 to R-15, CR-01 to CR-03) was spin coated on a silicon substrate having a 20-nm coating of silicon-containing spin-on hard mask SHB-A940 (Shin-Etsu Chemical Co., Ltd., silicon content 43 wt %) and baked (PAB) on a hotplate at the temperature shown in Table 3 for 60 seconds to form a resist film of 40 nm thick. Using an EUV scanner NXE3400 (ASML, NA 0.33, a 0.9, 90° dipole illumination), the resist film was exposed to EUV through a mask bearing a 36-nm 1:1 line-and-space (LS) pattern. The resist film was baked (PEB) on a hotplate at the temperature shown in Table 3 for 60 seconds and developed in the developer shown in Table 3 for 30 seconds to form a LS pattern having a space width of 18 nm and a pitch of 36 nm.

The LS pattern was observed under CD-SEM (CG-6300, Hitachi High-Technologies Corp.) and evaluated for sensitivity, LWR and maximum resolution by the following methods. The results are shown in Table 3.

Evaluation of Sensitivity

The optimum dose (Eop, mJ/cm$^2$) which provided an LS pattern with a space width of 18 nm and a pitch of 36 nm was determined and reported as sensitivity.

Evaluation of LWR

An LS pattern was formed by exposure in the optimum dose (Eop). The space width was measured at longitudinally spaced apart 10 points, from which a 3-fold value (3σ) of the standard deviation (σ) was determined and reported as LWR. A smaller value indicates a pattern having a lower roughness and more uniform space width.

Evaluation of Maximum Resolution

An LS pattern was formed while increasing the exposure dose little by little from the optimum dose (Eop). The line width (nm) which could be resolved was determined and reported as maximum resolution. A smaller value indicates a pattern having a better maximum resolution and smaller feature size.

TABLE 3

| | | Resist composition | PAB/PEB (° C.) | Developer | Eop (mJ/cm$^2$) | LWR (nm) | Maximum resolution (nm) |
|---|---|---|---|---|---|---|---|
| Example | 2-1 | R-01 | 130/60 | nBA | 42 | 4.0 | 16 |
| | 2-2 | R-02 | 130/60 | no development | 55 | 3.0 | 16 |
| | 2-3 | R-03 | 130/60 | no development | 54 | 3.2 | 16 |
| | 2-4 | R-04 | 130/60 | nBA | 48 | 3.5 | 13 |
| | 2-5 | R-05 | 130/60 | nBA | 50 | 3.8 | 14 |
| | 2-6 | R-06 | 130/60 | nBA | 49 | 3.2 | 12 |
| | 2-7 | R-07 | 130/60 | no development | 56 | 2.9 | 16 |
| | 2-8 | R-08 | 130/60 | nBA | 50 | 3.3 | 12 |
| | 2-9 | R-09 | 130/60 | nBA | 52 | 3.7 | 14 |
| | 2-10 | R-10 | 130/60 | nBA | 54 | 3.9 | 14 |
| | 2-11 | R-11 | 130/60 | nBA | 48 | 3.5 | 13 |
| | 2-12 | R-12 | 130/60 | nBA | 48 | 3.7 | 13 |
| | 2-13 | R-13 | 130/60 | nBA | 51 | 3.7 | 14 |
| | 2-14 | R-14 | 130/60 | nBA | 45 | 3.5 | 14 |
| | 2-15 | R-15 | 130/60 | nBA | 49 | 3.7 | 13 |
| Comparative | 2-1 | CR-01 | 105/90 | TMAH | 72 | 4.4 | 18 |
| Example | 2-2 | CR-02 | 105/90 | TMAH | 70 | 4.3 | 18 |
| | 2-3 | CR-03 | 105/90 | TMAH | 75 | 4.1 | 18 |

In the developer column 1, nBA stands for n-butyl acetate and TMAH for a 2.38 w % tetramethylammonium hydroxide aqueous solution.

It is evident from Table 3 that the resist compositions within the scope of the invention form LS patterns having satisfactory sensitivity, LWR and resolution when processed by the EUV lithography.

[3] EUV Lithography Test (Contact Hole Pattern)

Examples 3-1 to 3-15 and Comparative Examples 3-1 to 3-3

Each of the resist compositions (R-01 to R-15, CR-01 to CR-03) was spin coated on a silicon substrate having a 20-nm coating of silicon-containing spin-on hard mask SHB-A940 (Shin-Etsu Chemical Co., Ltd., a silicon content of 43 wt %) and baked (PAB) on a hotplate at the temperature shown in Table 4 for 60 seconds to form a resist film of 50 nm thick. Using an EUV scanner NXE3400 (ASML, NA 0.33, a 0.9/0.6, quadrupole illumination), the resist film was exposed to EUV through a mask bearing a hole pattern with a pitch of 64 nm+20% bias (on-wafer size). After exposure, the resist film was baked (PEB) on a hotplate at the temperature shown in Table 4 for 60 seconds and developed in the developer shown in Table 4 for 30 seconds to form a hole pattern having a size of 32 nm.

The hole pattern was observed under CD-SEM (CG-6300. Hitachi High-Technologies Corp.) and evaluated for sensitivity, CDU and maximum resolution by the following methods. The results are shown in Table 4.

Evaluation of Sensitivity

The optimum dose (Eop, $mJ/cm^2$) which provided a hole pattern with a size of 22 nm was determined and reported as sensitivity.

Evaluation of CDU

The size of 50 holes which were printed at Eop was measured, from which a 3-fold value (3σ) of the standard deviation (σ) was computed and reported as CDU. A smaller value of CDU indicates a hole pattern with more uniform hole diameter.

Evaluation of Maximum Resolution

A hole pattern was formed while reducing the exposure dose little by little from the optimum dose (Eop). The hole diameter (nm) which could be resolved was determined and reported as maximum resolution. A smaller value indicates a pattern having a better maximum resolution and smaller hole diameter.

TABLE 4

| | | Resist composition | PAB/PEB (° C.) | Developer | Eop ($mJ/cm^2$) | CDU (nm) | Maximum resolution (nm) |
|---|---|---|---|---|---|---|---|
| Example | 3-1 | R-01 | 130/60 | nBA | 24 | 2.9 | 28 |
| | 3-2 | R-02 | 130/60 | no development | 26 | 2.8 | 26 |
| | 3-3 | R-03 | 130/60 | no development | 26 | 2.6 | 26 |
| | 3-4 | R-04 | 130/60 | nBA | 28 | 2.6 | 26 |
| | 3-5 | R-05 | 130/60 | nBA | 28 | 2.7 | 26 |
| | 3-6 | R-06 | 130/60 | nBA | 26 | 2.4 | 24 |
| | 3-7 | R-07 | 130/60 | no development | 25 | 2.8 | 26 |
| | 3-8 | R-08 | 130/60 | nBA | 27 | 2.5 | 24 |
| | 3-9 | R-09 | 130/60 | nBA | 28 | 2.8 | 28 |
| | 3-10 | R-10 | 130/60 | nBA | 29 | 2.7 | 28 |
| | 3-11 | R-11 | 130/60 | nBA | 28 | 2.6 | 26 |
| | 3-12 | R-12 | 130/60 | nBA | 27 | 2.5 | 24 |
| | 3-13 | R-13 | 130/60 | nBA | 29 | 2.8 | 28 |
| | 3-14 | R-14 | 130/60 | nBA | 27 | 2.7 | 28 |
| | 3-15 | R-15 | 130/60 | nBA | 27 | 2.6 | 26 |
| Comparative | 3-1 | CR-01 | 105/90 | TMAH | 32 | 3.4 | 32 |
| Example | 3-2 | CR-02 | 105/90 | TMAH | 30 | 3.3 | 30 |
| | 3-3 | CR-03 | 105/90 | TMAH | 34 | 3.2 | 30 |

It is evident from Table 4 that the resist compositions within the scope of the invention form contact hole patterns having satisfactory sensitivity, CDU and resolution when processed by the EUV lithography.

Japanese Patent Application No. 2022-078510 is incorporated herein by reference. Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a hypervalent iodine compound having at least two acyloxy groups, a carboxylic acid, and a solvent, wherein the resist composition does not comprise a photoacid generator.

2. The resist composition of claim 1 wherein the hypervalent iodine compound has the formula (1):

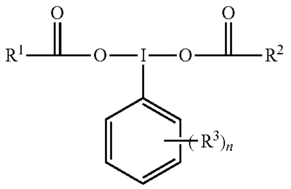

(1)

wherein n is an integer of 0 to 5, $R^1$ and $R^2$ are each independently halogen or a $C_1$-$C_{10}$ hydrocarbyl group which may contain a heteroatom, $R^1$ and $R^2$ may bond together to form a ring with the carbon atoms to which they are attached and the intervenient atoms, and $R^3$ is halogen or a $C_1$-$C_{40}$ hydrocarbyl group which may contain a heteroatom, when n is an integer of 2 to 5, a plurality of $R^3$ may be the same or different.

3. The resist composition of claim 1 wherein the carboxylic acid has the formula (2):

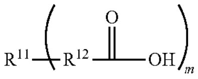

(2)

wherein m is an integer of 1 to 4, $R^{11}$ is a $C_1$-$C_{40}$ m-valent hydrocarbon group or $C_2$-$C_{40}$ m-valent heterocyclic group, when m is 2, $R^{11}$ may be an ether bond, carbonyl group, azo group, thioether bond, carbonate bond, carbamate bond, sulfinyl group or sulfonyl group, and some or all of the hydrogen atoms in the m-valent hydrocarbon group or m-valent heterocyclic group may be substituted by a heteroatom-containing moiety, and some constituent —$CH_2$— in the m-valent hydrocarbon group may be replaced by a heteroatom-containing moiety, $R^{12}$ is a single bond or $C_1$-$C_{10}$ hydrocarbylene group, and some or all of the hydrogen atoms in the hydrocarbylene group may be substituted by a heteroatom-containing moiety, and some constituent —$CH_2$— in the hydrocarbylene group may be replaced by a heteroatom-containing moiety, and when m is an integer of 2 to 4, a plurality of $R^{12}$ may be the same or different.

4. The resist composition of claim 3 wherein m is an integer of 2 to 4.

5. A pattern forming process comprising the steps of applying the resist composition of claim 1 onto a substrate to form a resist film thereon, exposing the resist film to high-energy radiation, and developing the exposed resist film in a developer.

6. The pattern forming process of claim 5 wherein the developer is an organic solvent.

7. The pattern forming process of claim 5 wherein the high-energy radiation is EB or EUV.

* * * * *